(12) United States Patent
Forrester et al.

(10) Patent No.: US 7,356,314 B2
(45) Date of Patent: Apr. 8, 2008

(54) SYSTEMS AND METHODS FOR REUSING A LOW NOISE AMPLIFIER IN A WIRELESS COMMUNICATIONS DEVICE

(75) Inventors: Tim Forrester, San Diego, CA (US); Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 444 days.

(21) Appl. No.: 10/417,882

(22) Filed: Apr. 17, 2003

(65) Prior Publication Data

US 2004/0209583 A1  Oct. 21, 2004

(51) Int. Cl.
*H04B 1/02* (2006.01)

(52) U.S. Cl. .................. 455/103; 455/107; 455/168.1; 455/188.1; 455/226.3; 455/266; 455/296

(58) Field of Classification Search ................ 455/553, 455/103, 188.1, 107, 168.1, 226.3, 266, 296
See application file for complete search history.

(56) References Cited

U.S. PATENT DOCUMENTS

| | | | | |
|---|---|---|---|---|
| 5,530,722 A | * | 6/1996 | Dent | 375/298 |
| 6,166,599 A | * | 12/2000 | Aparin et al. | 330/149 |
| 6,185,434 B1 | * | 2/2001 | Hagstrom et al. | 455/552.1 |
| 6,308,048 B1 | * | 10/2001 | Gore et al. | 455/76 |
| 6,405,025 B1 | * | 6/2002 | Keski-Mattinen | 455/266 |
| 6,424,221 B1 | * | 7/2002 | Korn | 330/282 |
| 6,466,768 B1 | * | 10/2002 | Agahi-Kesheh et al. | 455/78 |
| 6,529,715 B1 | * | 3/2003 | Kitko et al. | 455/103 |
| 6,584,304 B1 | * | 6/2003 | Thomsen et al. | 455/188.1 |
| 6,694,129 B2 | * | 2/2004 | Peterzell et al. | 455/76 |
| 6,714,099 B2 | * | 3/2004 | Hikita et al. | 333/133 |
| 6,816,711 B2 | * | 11/2004 | Standke et al. | 455/73 |
| 2002/0101907 A1 | * | 8/2002 | Dent et al. | 375/132 |
| 2002/0109563 A1 | * | 8/2002 | Bradley et al. | 333/187 |
| 2003/0003886 A1 | * | 1/2003 | Kato et al. | 455/127 |
| 2003/0030494 A1 | * | 2/2003 | Huang | 330/302 |
| 2003/0098631 A1 | * | 5/2003 | Ruby et al. | 310/312 |

* cited by examiner

*Primary Examiner*—Quynh H. Nguyen

(57) ABSTRACT

A wireless communication device comprises a plurality of receive signal paths, each of the receive signal paths is configured to receive signals in a certain frequency bandwidth. The communication device also comprises an amplifier coupled with each of the plurality of receive signal paths. The amplifier is configured to amplify the receive signals associated with each of the plurality of receive signal paths.

20 Claims, 15 Drawing Sheets

SYSTEMS AND METHODS FOR REUSING A LOW NOISE AMPLIFIER IN A WIRELESS COMMUNICATIONS DEVICE

BACKGROUND

1. Field of the Invention

The present invention generally relates to wireless communication devices that are configured for operation using a plurality of communication bands and more particularly to GPS enabled multi-band wireless communication devices.

2. Background Information

A conventional hand-held Global Positioning System (GPS) device provides positional information, related to the location of the GPS device, by receiving and processing GPS band signals from a GPS system. Although such positional information can be quite useful, it is not always convenient to carry a conventional GPS device. Especially, if the user must also carry around one or more other portable devices, such as a laptop, wireless handset, Personal Digital Assistant (PDA), or other portable device on which users now depend. It is therefore desirable that a GPS positioning function be integrated within one of these other portable devices.

Unfortunately, the integration of GPS technology with other portable devices has proven difficult. For example, three methods for adding GPS capability to a wireless handset have been implemented, but have proven unsatisfactory in use.

The first method is to add GPS capability in a wireless handset by adding a separate antenna for GPS reception. Since the wireless network antenna is not modified, network communications quality is not adversely affected. However, as mobile handsets for wireless networks have become much smaller, less space is available in the handset housing to accommodate a separate, custom-designed GPS antenna. Furthermore, a GPS antenna disposed within the handset housing typically suffers from a number of reception problems. For example, poor reception can be caused by electromagnetic shielding within the handset housing and by the handset housing itself. Adjusting the electromagnetic shielding to accommodate the GPS antenna can cause substantial redesign and testing of the handset. Also, adding a separate antenna and its associated circuitry to the wireless handset adds expense and design complexity.

The second method is to add GPS capability to a wireless handset by enabling the existing network antenna on the wireless handset to adequately receive a GPS band signal. For example, a typical dual-band antenna may be constructed to receive a PCS signal at approximately 1900 MHz and a cellular signal at approximately 800 MHz. It may therefore be possible that the existing dual-band antenna may be able to receive a GPS signal at approximately 1575 MHz. However, the GPS signal is at a non-resonant frequency for the dual-band antenna, so the received GPS signal would be less than optimal resulting in degraded signal transfer. In this regard, known dual-band antenna systems are not able to receive a GPS signal with sufficient strength and quality to implement a robust GPS location functionality on a wireless handset.

The third method is to add GPS capability to a wireless handset using a tri-band antenna. A tri-band antenna is constructed to receive the cellular, PCS and GPS frequencies, for example. Due to the limitations of antenna design, however, such an antenna normally compromises either the cellular or PCS performance, or both. Using a tri-band antenna also adds substantial extra cost to the antenna.

SUMMARY OF THE INVENTION

The present invention alleviates to a great extent the disadvantages of conventional systems and methods for providing a global positioning system (GPS) enabled antenna in a wireless communications device, such as a wireless handset.

In an exemplary embodiment, the present invention provides a system and a method for providing a GPS enabled antenna for a wireless communications device. The wireless communication device includes a GPS switching module coupled to a conventional communications antenna and associated circuitry. The GPS switching module is adapted to selectively couple the communications antenna to GPS matching circuitry. In this arrangement, the GPS matching circuitry adjusts impedance at approximately 1575 MHz to more closely match the communications antenna to GPS circuitry in the wireless device, thus ensuring an optimal transfer of antenna signal energy to the GPS receiver.

These and other features and advantages of the present invention will be appreciated from review of the following detailed description of the present invention, along with the accompanying figures in which like reference numerals refer to like parts throughout.

DETAILED DESCRIPTION OF THE INVENTION

Figure 1:
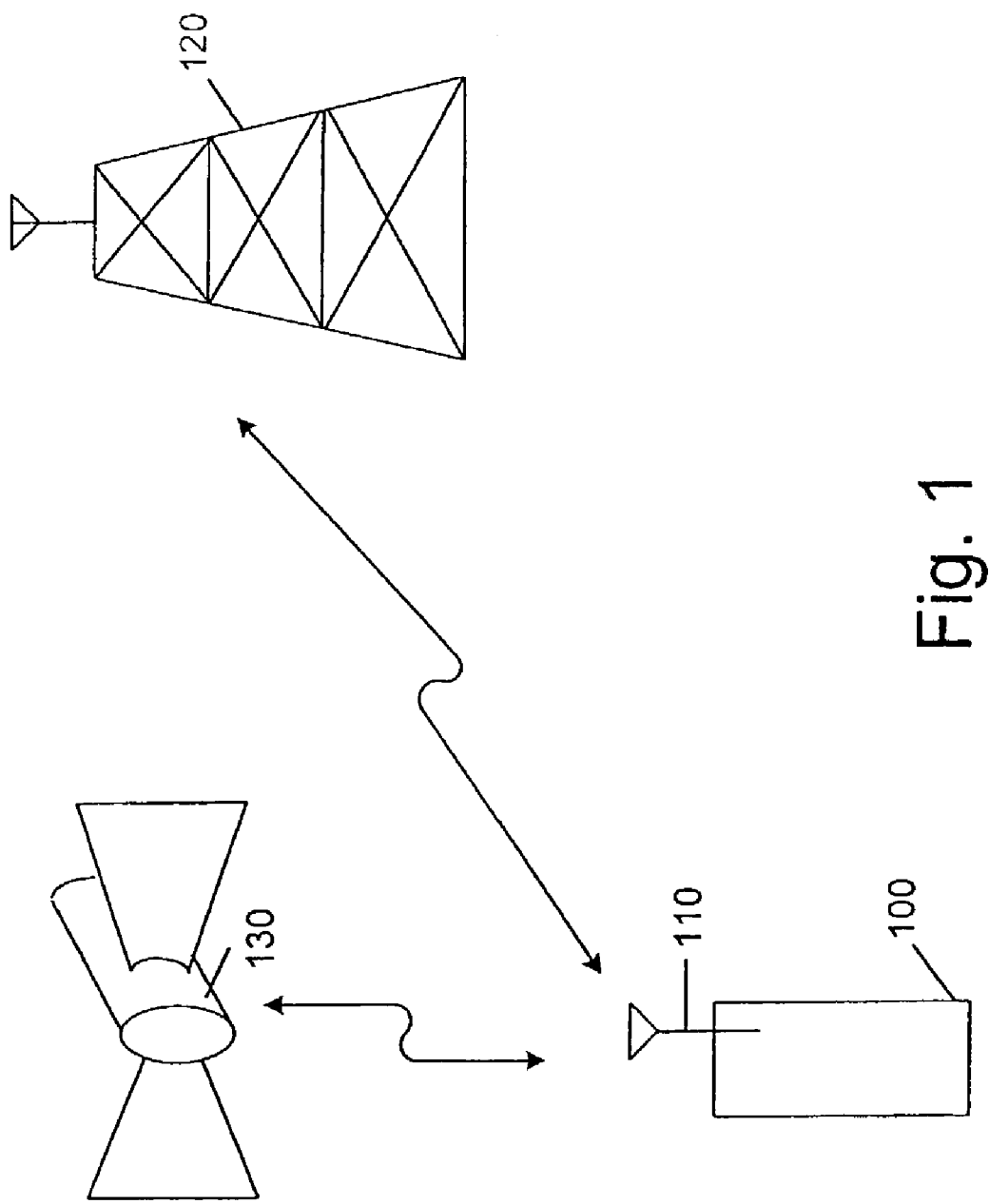
FIG. 1 shows a representation illustrating an exemplary embodiment of a wireless communications system according to the present invention.

FIG. 1 illustrates an exemplary embodiment of a wireless communications system including a wireless communication device 100 according to the present invention. Wireless communication device 100 can, for example, be a wireless handset, a car phone, a cordless phone, a laptop computer or other computing device with a wireless modem, a pager, or a personal digit assistance (PDA) with wireless communication capability. Further, wireless communication device 100 can use digital or analog technology or some combination thereof. Thus, the descriptions below should not be seen as limiting the systems and methods described herein to any particular type of wireless communication device.

Wireless communication device 100 includes an antenna 110. Antenna 110 is structured to transmit and receive wireless communication signals. In FIG. 1, antenna 110 is in two-way communications with a base station 120. Base station 120 can, for example, be one of a plurality of base stations 120 in a wireless communications network. Antenna 110 is also in at least one-way communication with one or more GPS satellites, such as GPS satellite 130. GPS satellite 130 can, for example, be one of a plurality of GPS satellites in a constellation of GPS satellites.

In one example embodiment, wireless communication device 100 is a wireless handset having an antenna 110 adapted to receive and transmit wireless communication signals using at least two different communication bands. The two bands can include, for example, the cellular band, a band at approximately 800 MHz, and the PCS band, a band at approximately 1900 MHz. In this exemplary embodiment, antenna 110 is a conventional dual-band antenna constructed to receive and transmit wireless signals on both the PCS and cellular bands. It will be appreciated that more or fewer communication bands can be accommodated by appropriate selection of known antennas and associated circuitry. For example, wireless communication device 100 can be constructed to use only the PCS band, or can be constructed to receive and transmit on three or more communication bands. It will be understood that there are many communication bands in use throughout the world, and it will be further understood that the systems and methods described herein are not limited to any particular communication bands or sets of communication bands.

Antenna 110 can be a conventional antenna, such as a standard dual-band antenna. Antenna 110 on wireless communication device 100 is, however, configured to robustly receive position location signals, such as a GPS signal from satellite 130. Accordingly, GPS position capability can be economically and conveniently added to wireless communication device 100.

Figure 2A:
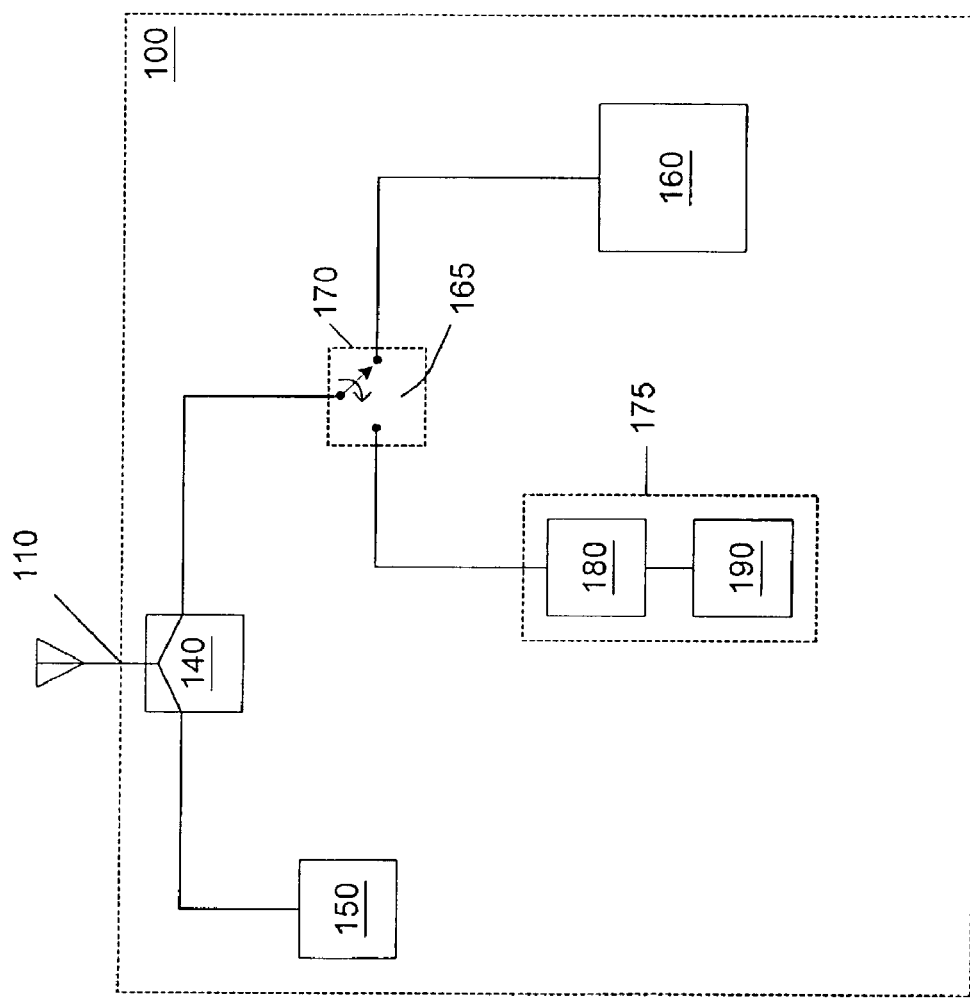
FIG. 2A shows selected components of an exemplary embodiment of a wireless communications device according to the present invention.
Figure 9:
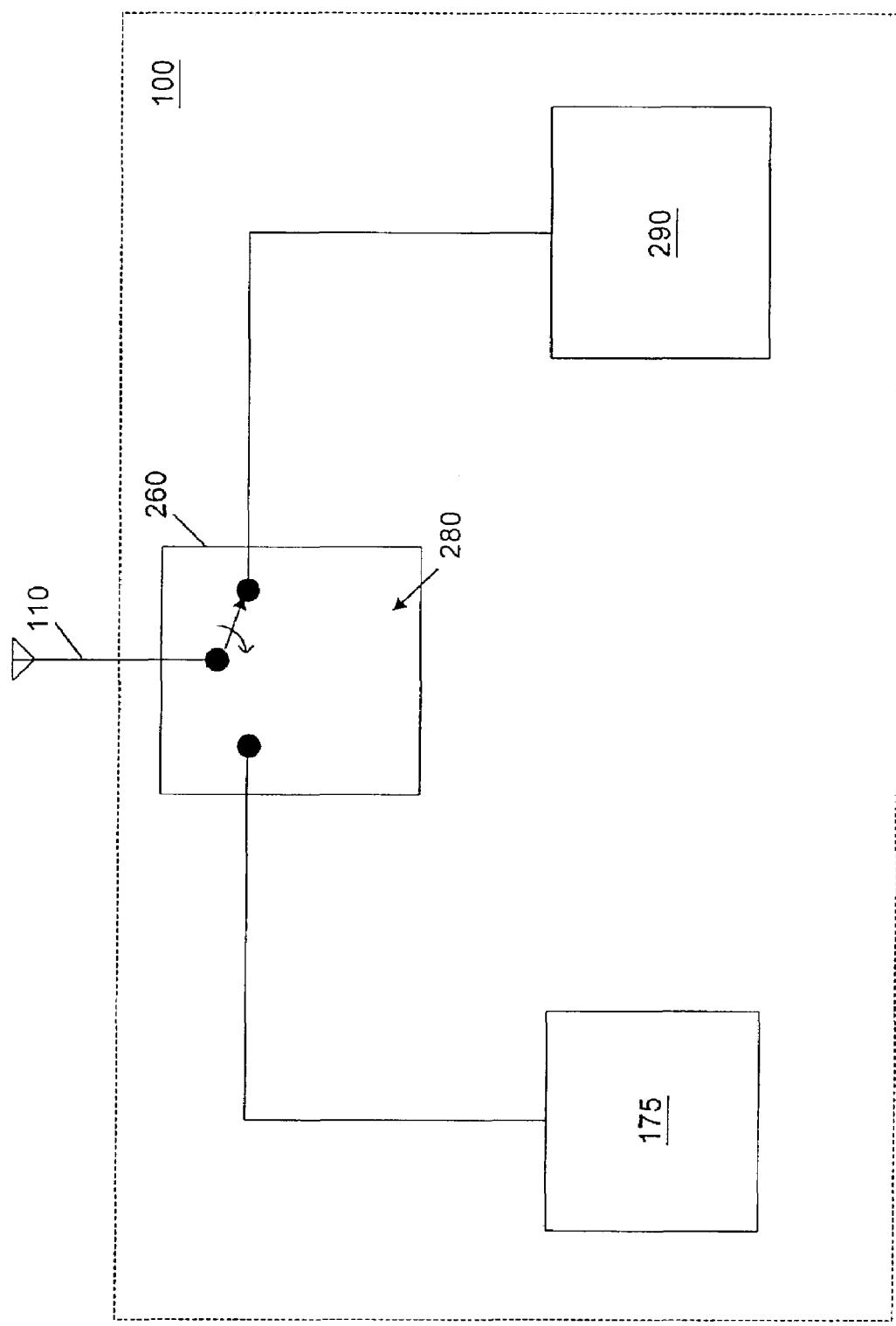
FIG. 9 shows selected components of yet another exemplary embodiment of the wireless communications device of FIG. 2A according to the present invention.

FIG. 2A illustrates a circuit for receiving a GPS signal using a conventional communication antenna 110 in wireless communication device 100. Wireless communication device 100 can include, for example, antenna 110, a diplexer 140, a first band, e.g., cellular band, duplexer 150, a second band, e.g., PCS band, duplexer 160, a GPS switching module 170 and a GPS module 175. As an alternative to diplexer 140, a two-way switch (as illustrated in FIG. 9) can be used. As shown in FIG. 2A, switching module 170 can include, for example, a switch 165. GPS module 175 can include, for example, an impedance matching module 180 coupled to a GPS Low Noise Amplifier (LNA) 190. It will be appreciated that the circuit illustrated in FIG. 2A is for explanation only and that additional well-known circuitry must be added to construct a working wireless communication device 100.

As illustrated in FIG. 2A, antenna 110 is coupled to diplexer 140. Diplexer 140 is coupled to first band duplexer 150. Diplexer 140 is also coupled to switching module 170. Switching module 170, in turn, is coupled to second band duplexer 160. Switching module 170 is also coupled to GPS module 175. In an exemplary embodiment, switching module 170 is coupled to an impedance matching module 180 within GPS module 175, which, in turn, is coupled to GPS LNA 190.

Again, although not shown, additional components can be included in the wireless communication device 100. For example, a GPS signal processor can be coupled to GPS LNA 190. In another example, transmitters and/or receivers can be coupled to duplexers 150 and 160. Such additional components are known and are not described here in detail.

Figure 3A:
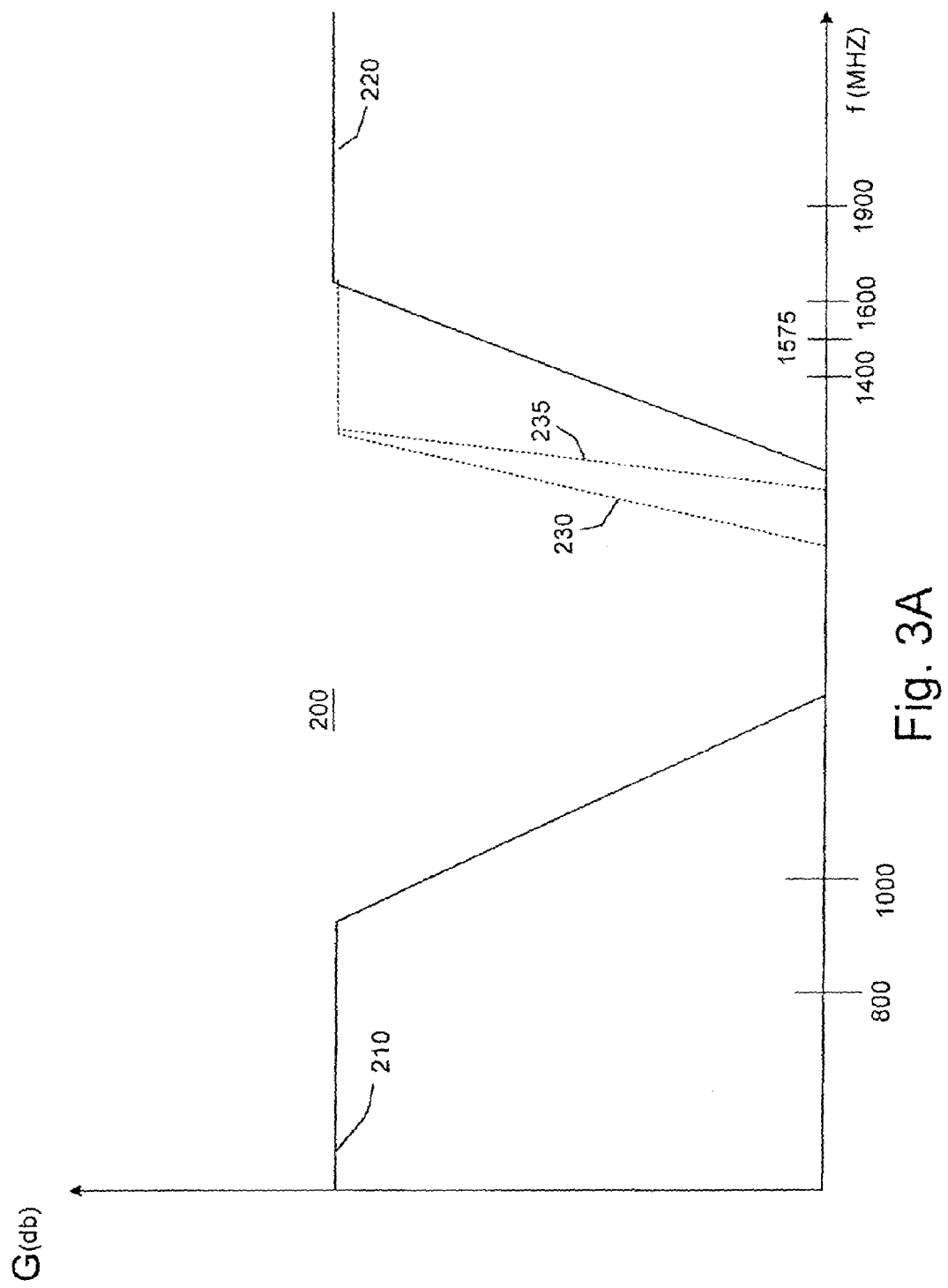
FIG. 3A is a plot of a frequency response of a diplexer that can be included in the wireless communication device of FIGS. 2A and 2B according to an exemplary embodiment of the present invention.

A diplexer is typically used to direct communications signals responsive to a particular communication band or bands. For example, diplexer 140 separates a signal received on antenna 110 into a PCS path or cellular path. FIG. 3A illustrates an exemplary composite frequency response 200 for an exemplary diplexer 140. The frequency response 200 includes a low pass filter characteristic 210 of a low pass filter included in diplexer 140, and a high pass filter characteristic 220 of a high pass filter included in diplexer 140. The low pass filter characteristic 210 is illustrated with a cutoff frequency of approximately 1000 MHz and is designed to pass the cellular band. The high pass filter characteristic 220 is illustrated with a cutoff frequency of approximately 1600 MHz and is designed to pass the PCS band. It will be appreciated that the cutoff frequencies can be adjusted to accommodate particular applications, and that other cutoff frequencies can be selected for other communication bands. The high pass filter characteristic 220 can also be designed to pass, with some acceptable level of attenuation, a signal in the GPS band.

In operation, wireless communication signals in multiple wireless communication bands, e.g., the cellular and PCS bands, is received by antenna 110. Diplexer 140 splits the wireless communication signals into a first signal and a second signal. The first signal is filtered by the low pass filter of diplexer 140 and then coupled to first band duplexer 150. The second signal is filtered by the high pass filter of diplexer 140 and then coupled to switching module 170. First band duplexer 150 can then be configured to couple the first signal to, for example, a cellular receiver (not shown). In addition, the low pass filter blocks higher frequency band signals from passing to first band duplexer 150. High pass filter of diplexer 140 passes the second signal to second band duplexer 160 via switching module 170.

If the multiple received wireless communication signals also include, for example, GPS band signals, then the high pass filter passes, with some small amount of attenuation, the GPS band signals to GPS module 175 via switching module 170. When using a conventional antenna 110, the attenuation is caused, in part, because antenna 110 is not optimized for the GPS band. In GPS module 175, impedance matching module 180 provides an impedance match that is tuned for the GPS band. GPS signals received from switching module 170 can then be amplified by GPS LNA 190 before being processed by conventional GPS circuitry (not shown).

The high pass filter of diplexer 140 also blocks lower frequency band signals. Wireless communication device 100 operates, in one example embodiment, with switching module 170 coupling diplexer 140 to duplexer 160. At a selected time or interval, however, it may be desirable to obtain position information. For example, position information can be useful when a user dials an emergency number. Wireless communication device 100 can also be running an application, such as a mapping application, where position is periodically needed. In another example, a user can instruct wireless communication device 100 to obtain position information. It will be appreciated that many applications exist for a wireless communication device 100 in which position information is useful.

When position information is needed, switching module 170 can be switched by control circuitry (not shown) to couple antenna 110 to GPS module 175. When configured in this manner, a GPS band signal at approximately 1575 MHz can be received by antenna 110 and transmitted to GPS module 175. Since antenna 110 is, for example, a dual-band antenna tuned to receive signals at approximately 800 MHz and at approximately 1900 MHz, the GPS signal at approximately 1575 MHz is unmatched. Accordingly, matching module 180 includes matching circuitry to more closely match the impedance between GPS module 175 and antenna 110 when it is receiving a GPS signal. As a result, a high quality GPS signal can be received and forwarded to GPS LNA 190.

In another exemplary embodiment, the composite frequency response 200 present in diplexer 140 can be adapted to pass, with less attenuation, the GPS band. Thus, the high pass filter characteristic 220 can be modified by shifting the cutoff frequency from, for example, approximately 1600 MHz to, for example, approximately 1400 MHz, as illustrated by adapted characteristic 230 in FIG. 3A. The adapted characteristic 230 can also have other differing parameters such as, for example, a different attenuation slope 235. As a result, the GPS band is attenuated even less by the adapted high pass filter characteristic 230 than by the high pass filter characteristic 220. Specifically, for example, by lowering the cutoff frequency from approximately 1600 MHz (as in normal cellular/PCS diplexer) to approximately 1400 MHz, the GPS band at approximately 1575 MHz is less attenuated by the diplexer 140, e.g., the attenuation can change from approximately −1.3 dB to approximately −0.3 dB.

Figure 2B:
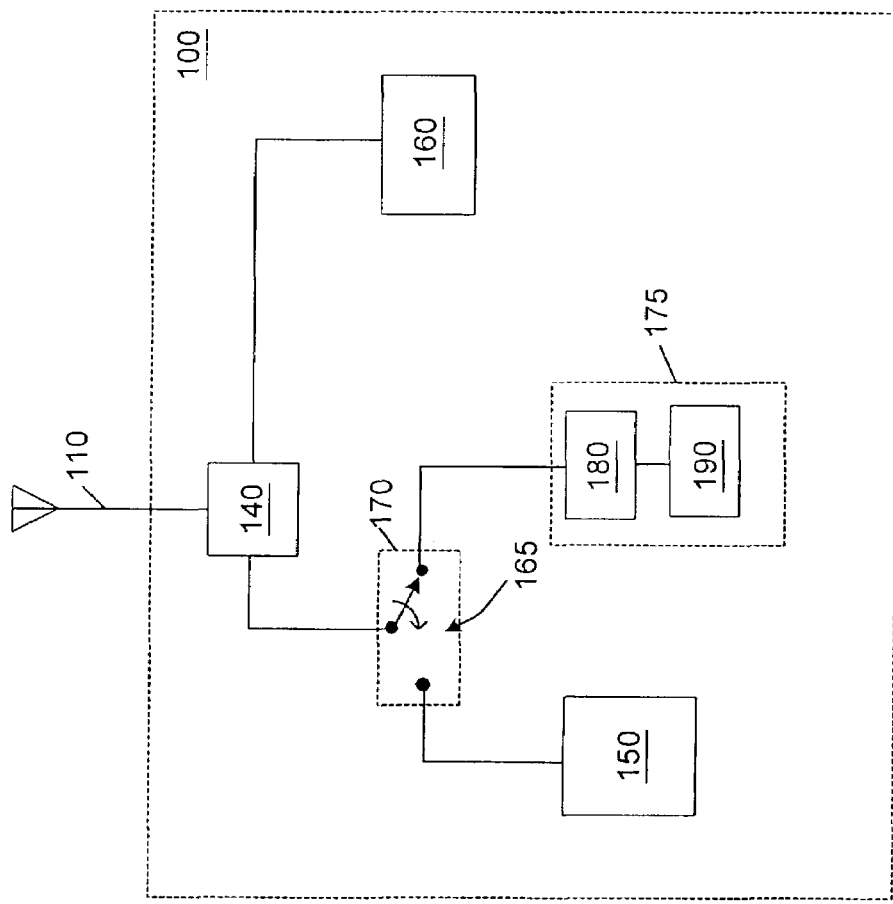
FIG. 2B shows selected components of another exemplary embodiment of the wireless communication device of FIG. 2A according to the present invention.
Figure 3B:
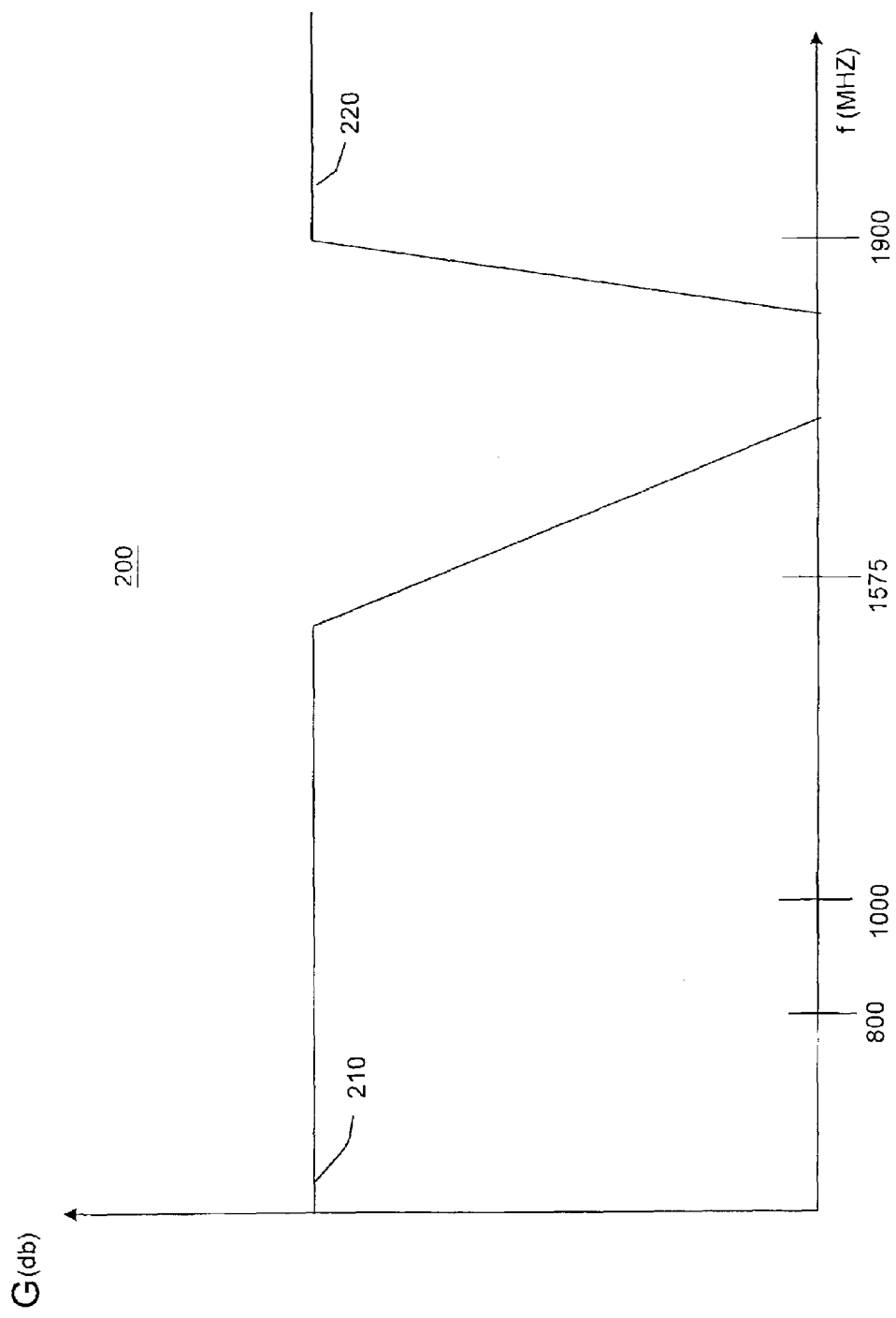
FIG. 3B shows a plot of a frequency response of the diplexer of FIG. 3A according to another exemplary embodiment of the present invention.

FIG. 2B illustrates example components of another example embodiment of a wireless communication device 100 configured too receive a GPS signal using a conventional antenna 110. The components are configured in a manner similar to those illustrated in FIG. 2A, except that diplexer 140 separates a signal received by antenna 110 into a PCS path and a cellular/GPS path. Accordingly, switching module 170 is on the cellular/GPS path. Another example of a frequency response 220 of diplexer 140 is illustrated in FIG. 3B. In this example, the low pass filter characteristic 210 of the low pass filter of diplexer 140 extends to higher frequencies to include the GPS band at approximately 1575 MHz. Accordingly, the low pass filter of diplexer 140 passes the GPS band signals or passes the GPS band signals with a small amount of attenuation to the cellular/GPS path.

Figure 4:
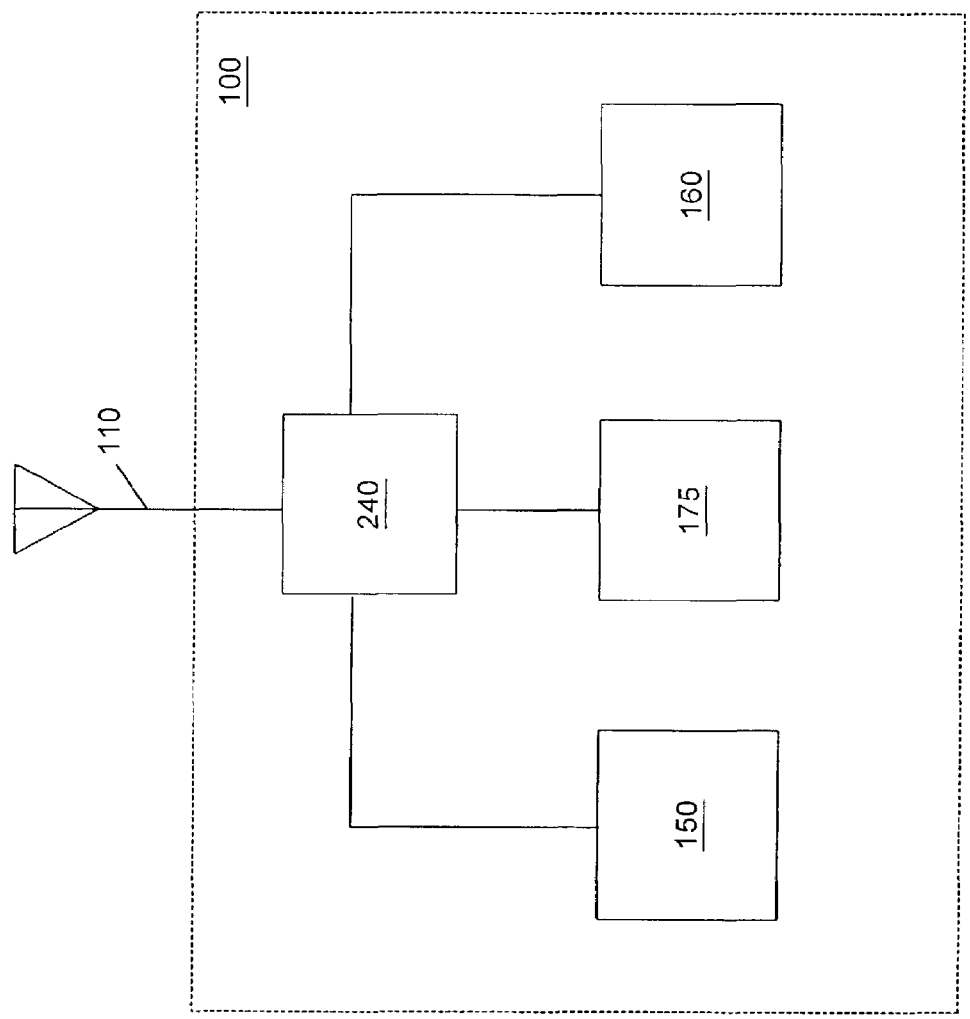
FIG. 4 shows selected components of another exemplary embodiment of the wireless communication device of FIG. 2A according to the present invention.

FIG. 4 illustrates exemplary components of another example embodiment of a wireless communication device 100 according to the systems and methods described herein. In the example embodiment of FIG. 4, wireless communication device 100 can include antenna 110, first band duplexer 150, second duplexer 160, GPS module 175, and a triplexer 240. Triplexer 240 couples antenna 110 to first band duplexer 150, second band duplexer 160, and GPS module 175.

Figure 5:
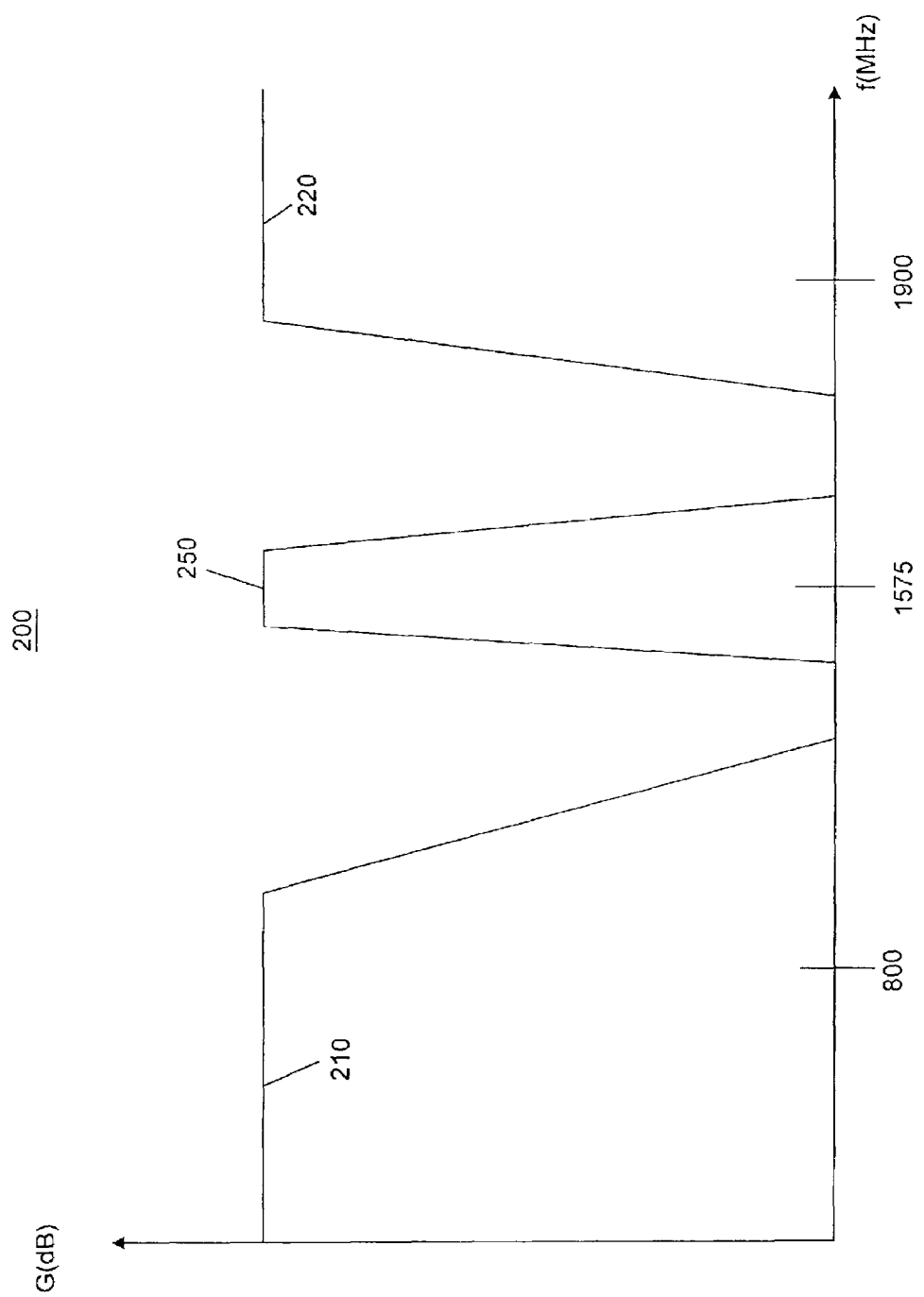
FIG. 5 is a plot of a frequency response of a triplexer that can be included in the wireless communication device of FIG. 4 according to an exemplary embodiment of the present invention.

An exemplary frequency response 200 for triplexer 240 is illustrated in FIG. 5 including a low pass filter characteristic 210 of a low pass filter, a high pass filter characteristic 220 of a high pass filter, and a band pass filter characteristic 250 of a band pass filter, all included in triplexer 240. The low pass filter characteristic 210 is illustrated with a cutoff frequency of, for example, approximately 1000 MHz and is designed to pass, for example, the cellular band. The high pass filter characteristic 220 is illustrated with a cutoff frequency of, for example, approximately 1600 MHz and is designed to pass, for example, the PCS band. The band pass filter characteristic 250 is centered, for example, at approximately 1575 MHz and designed to pass, for example, the GPS band. The characteristics 210, 220, and 250 can overlap depending on the implementation. Further, other filter characteristics designed for these and other wireless communication bands can be included within triplexer 240 as required by a particular implementation.

In operation, wireless communication signals are received by antenna 110. Triplexer 240 splits the received wireless communication signal into a first signal, a second signal, and a third signal. If the wireless communication signal includes, for example, cellular band communication signals, then the low pass filter of triplexer 240 passes the cellular band communication signals to first band duplexer 150. In addition, the low pass filter can be configured to block higher frequency band signals from passing to first band duplexer 150. If the wireless communication signal includes, for example, PCS band communication signals, then the high pass filter passes the PCS band communication signals to second band duplexer 160. In addition, the high pass filter can be configured to block lower frequency band from passing to second band duplexer 160. If the wireless communication signal includes, for example, GPS band signals, then the band pass filter passes the GPS band signals to GPS module 175.

GPS module 175, can include an impedance matching module 180 configured to match the received GPS signal. The GPS signal is then amplified by GPS LNA 190 before being processed by conventional GPS circuitry (not shown). In addition, the band pass filter can be configured to block higher and lower frequency bands from passing to GPS module 175.

Figure 8:
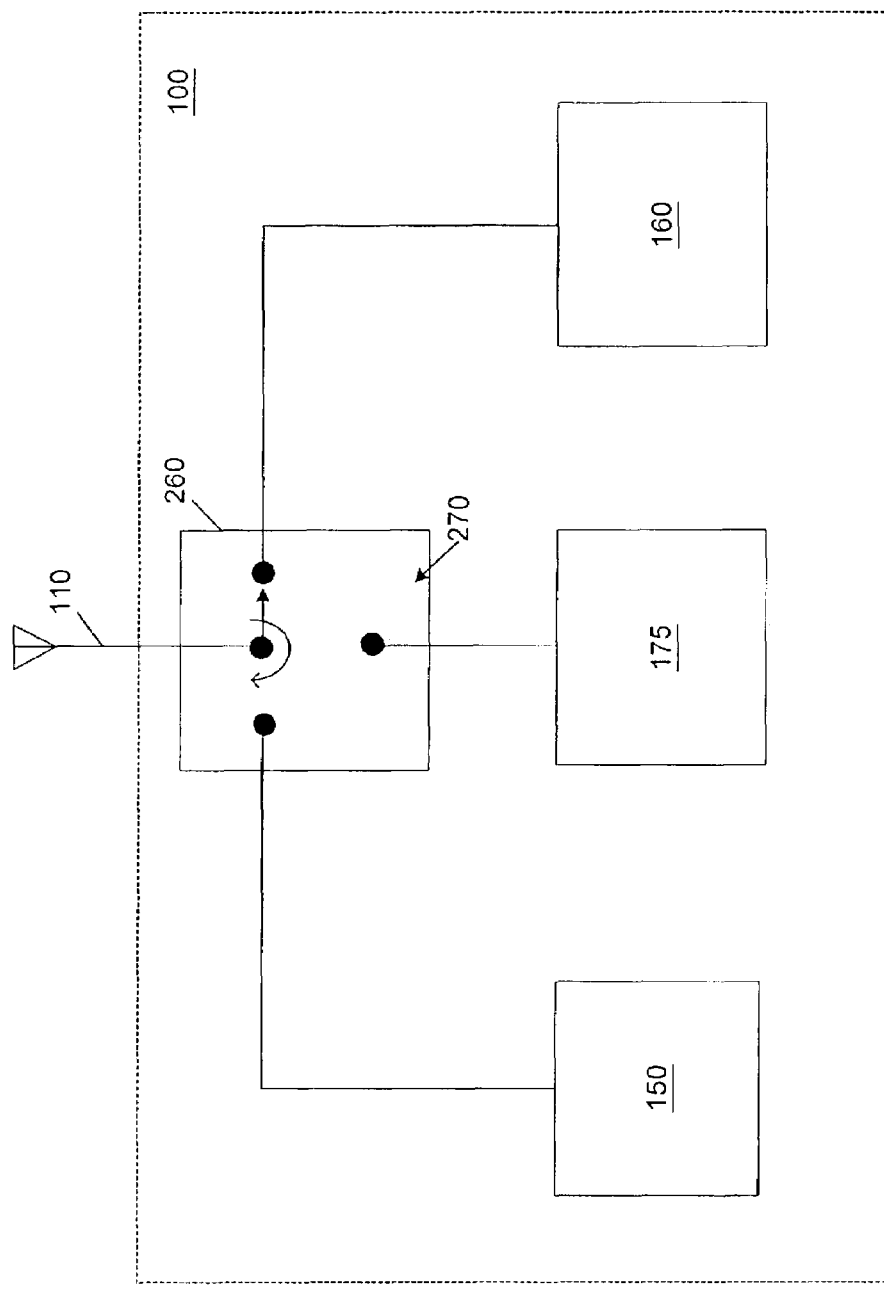
FIG. 8 shows selected components of another embodiment of the wireless communications device of FIG. 2A according to the present invention.

FIG. 8 illustrated another exemplary embodiment of a wireless communication device 100 in which a switching module 260 is used instead of triplexer 240. In this example embodiment, antenna 110 is coupled to first band duplexer 150, second band duplexer 160, and GPS module 175 via switching module 260. Switching module 260 can include, for example, a three-way switch 270. Switching module 260 can be controlled via a main controller (not shown) of wireless communications device 100 such as, for example, a processor, e.g., a mobile station modem (MSM).

Thus, for example, a cellular band signal can be switched by switching module 260 to first band duplexer 150; a PCS band signal can be switched to second band duplexer 160; and a GPS signal can be switched to GPS module 175. The cellular communications circuitry and the PCS communications circuitry can include, for example, band-optimized signal matching circuitry for use with the respective band.

FIG. 9 illustrates yet another exemplary embodiment of wireless communications device 100 configured in accordance with the systems and methods described herein. In this exemplary embodiment, wireless communication device 100 is configured to receive a GPS signal or a communication band signal, e.g., a cellular band signal or a PCS band signal. Antenna 110 is coupled to GPS module 175 and to communication band duplexer 290 via a switching module 260. Switching module 260 can include, for example, a two-way switch 280. Switching module 260 can be controlled via a main controller (not shown) of wireless communication device 100 such as, for example, a processor, e.g., a MSM. Switching module 260 switches the signal received via antenna 110 to the appropriate output. Thus, for example, received cellular band signals can be switched to the communication band duplexer 290. Alternatively, a GPS signal can be switched to GPS module 175. The communication band circuitry can include, for example, band-optimized signal matching circuitry for use with the communications band.

Figure 6:
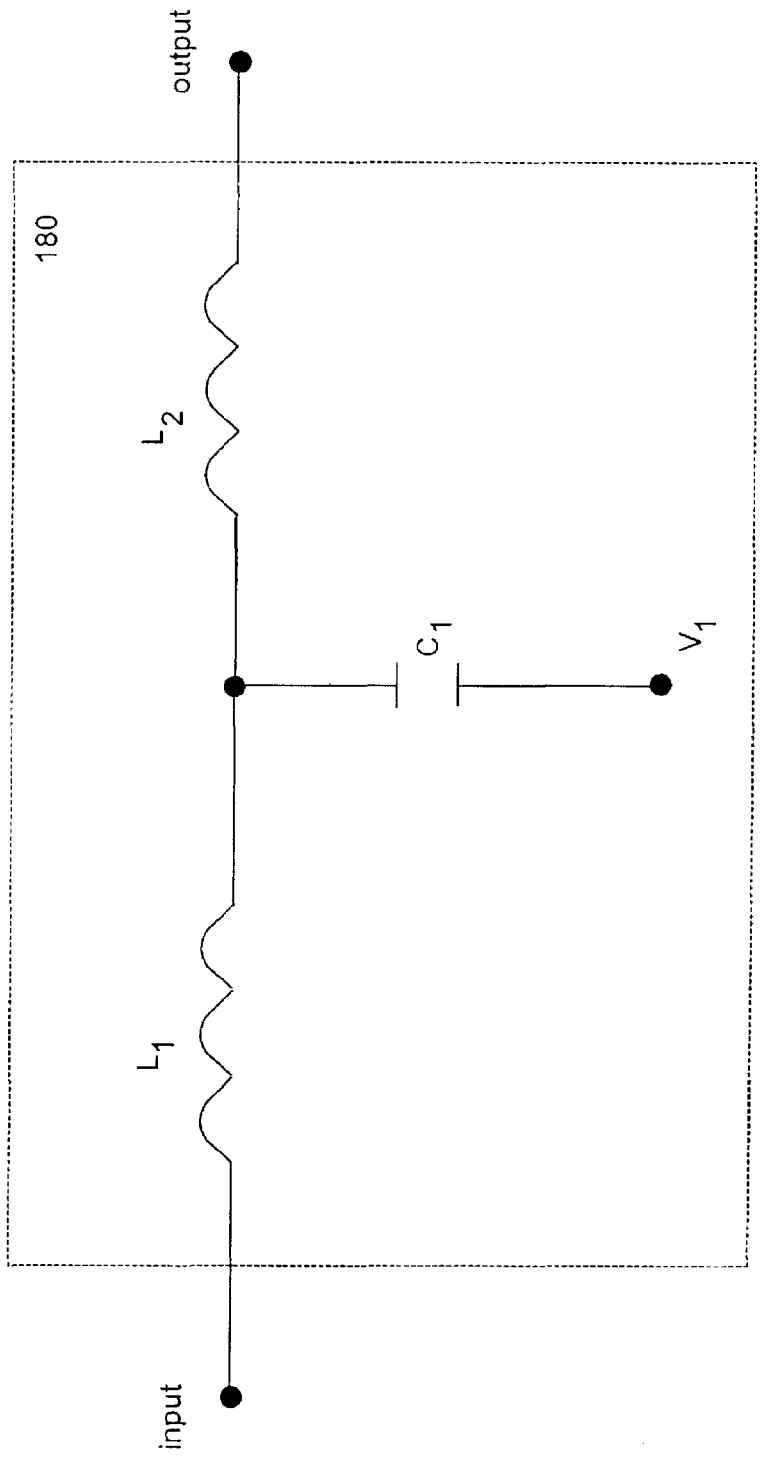
FIG. 6 shows an example of a conventional matching network that can be included in the wireless communication device of FIG. 2A.

It will be appreciated that matching module 180 or other matching circuitry can be implemented using a wide variety of circuits. FIG. 6 illustrates one such implementation of a matching circuit. In FIG. 6, an input to matching module 180 is coupled to a first inductor $L_1$. Inductor $L_1$ is coupled to the output of matching module 180 via a second inductor $L_2$. Inductor $L_1$ is also coupled to a voltage potential $V_1$, e.g., electrical or chassis ground, via a capacitor $C_1$. Such matching circuits are well known in the art. Matching module 180 can include other types of matching circuits and their dual band equivalents. Such matching circuits can also include, for example, passive elements.

Figure 7:
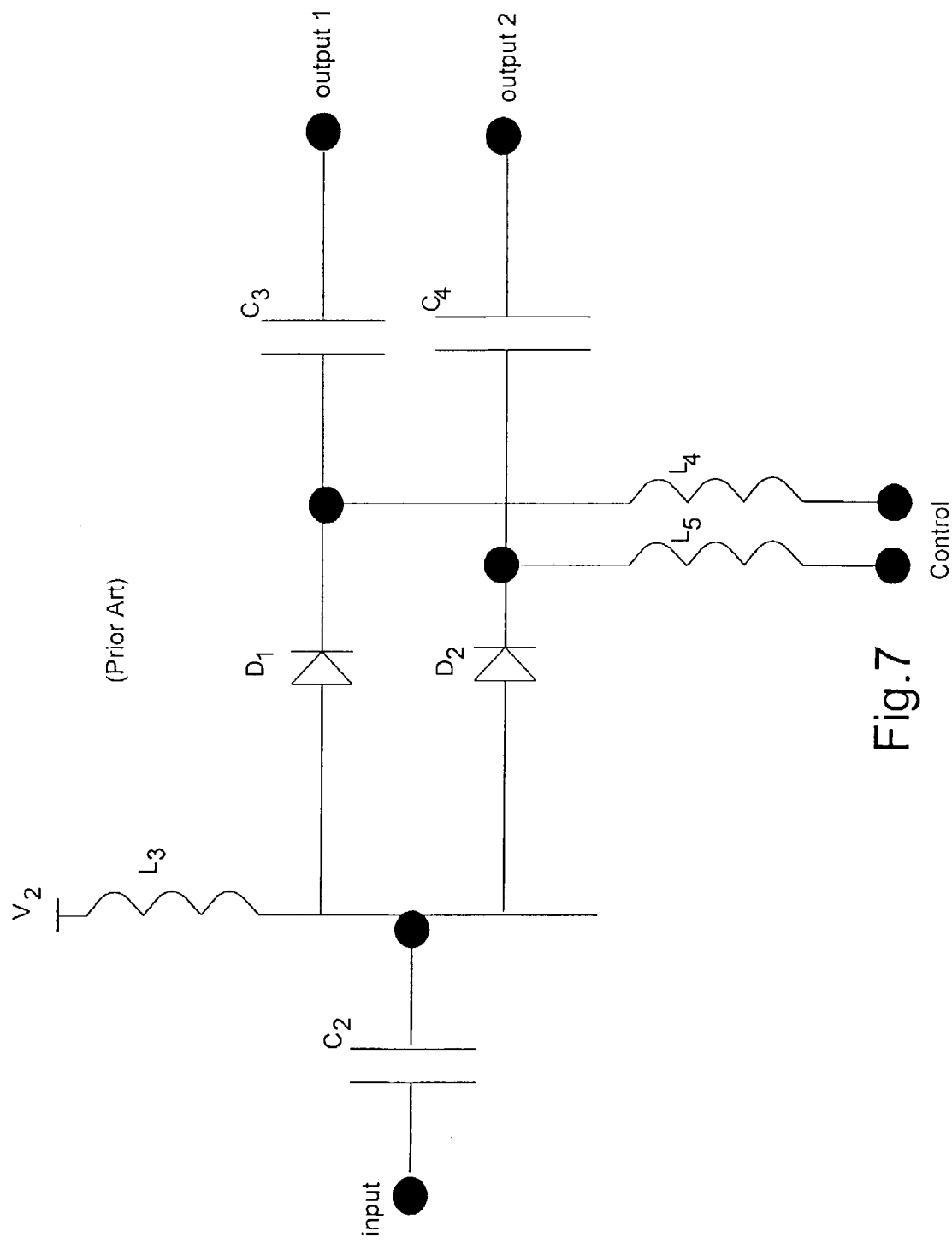
FIG. 7 shows an example of a conventional switching circuit that can be included in the wireless communication device of FIG. 2A.

It will also be appreciated that switch module 170 can be implemented in several circuit arrangements. FIG. 7 illustrates one such arrangement of switching module 170 according to systems and methods described herein. An input to switching module 170 is coupled to a first capacitor $C_2$. Capacitor $C_2$ is coupled to a voltage potential $V_2$, e.g., battery supply voltage, via a first inductor L3. Capacitor $C_2$ is also coupled to two output branches. In a first output branch, capacitor $C_2$ is coupled to a first diode $D_1$. Diode $D_1$ is coupled to the first output branch via a second capacitor $C_3$. Diode $D_1$ is also coupled to a first control signal via a second inductor $L_4$. In a second branch of the circuit, capacitor $C_2$ is coupled to a second diode $D_2$. Diode $D_2$ is coupled to the second output branch via a third capacitor $C_4$. Diode $D_2$ is also coupled to a second control signal via a third inductor $L_5$.

Briefly, the first control signal and the second control signal provide desired potential differences across the diodes D1 and D2, which turns diodes D1 and D2 either on or off, i.e., an approximately short circuit or an approximately open circuit respectively. Switching module 170 can comprise other variations and examples of switching circuitry as well.

Referring back to FIG. 4, it can be seen that using a triplexer 240 reduces the number of components in the receive path for one or more of the signals received by antenna 110. This is because using triplexer 240 eliminates the need for a switch, such as switching module 170. Reducing the number of components reduces the circuit board area requirements and lowers the bill of material costs for wireless communication device 100. Eliminating switching module 170 also reduces the insertion loss for the receive path, which increases the sensitivity and improves the performance of wireless communication device 100.

Figure 10:
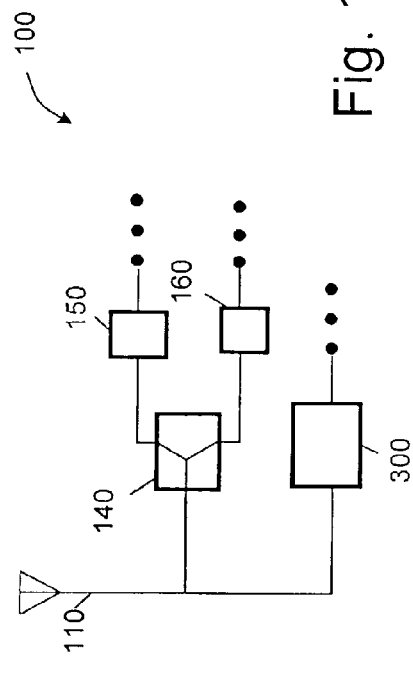
FIG. 10 shows selected components of an example embodiment of a wireless communication device comprising a triplexer in accordance with the invention.

One way to implement a triplexer 240 in a wireless communication device 100 is illustrated in FIG. 10. Here antenna 110 is coupled to a conventional diplexer, such as diplexer 140. In addition, however, antenna 110 is also coupled with a filter 300 that is configured to act as a band pass filter for signals in the GPS band. In other words, referring to FIG. 5, diplexer 140 in FIG. 10 can be configured to exhibit the low and high pass filter characteristics 210 and 220, respectively, while filter 300 can be configured to exhibit band pass filter characteristic 250.

Conventionally, inductor and capacitor components (L/Cs) have been used to construct filters with the required characteristics, such as those illustrated in FIG. 6. Thus, filter 300 can comprise an L/C filter designed to provide band pass filter characteristic 250. Alternatively, such filters can be implemented using Surface Acoustic Wave (SAW) devices. In a SAW device, electrical signals are converted to mechanical waves that travel across the surface of the device and are then converted back to electrical signals. Thus, filter 300 can also comprise a SAW filter. Similarly, diplexer 140 can be constructed from L/C filters or SAW filters.

Figure 11:
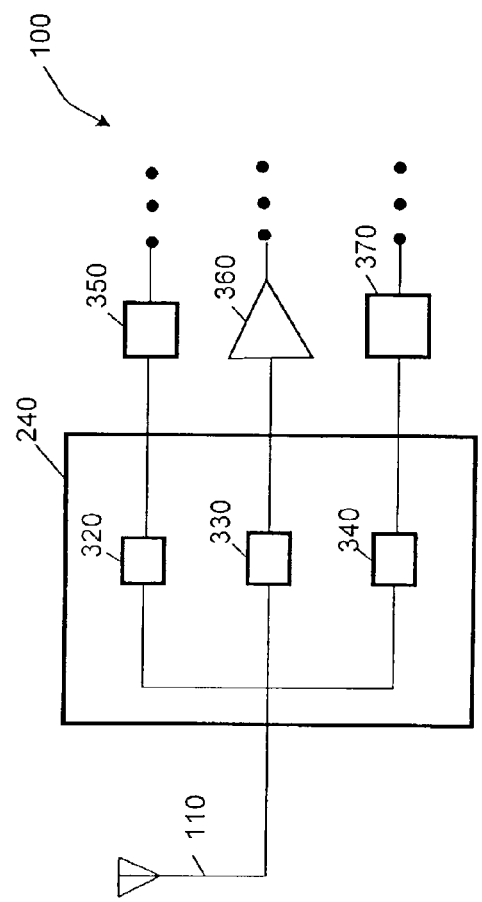
FIG. 11 shows selected components of another exemplary embodiment of the wireless communication device illustrated in FIG. 10.

Triplexer 240 can, therefore, be described as comprising three filters configured to operate at three different frequency bands as illustrated in FIG. 11. As can be seen in FIG. 11, triplexer 240 can comprises a filter 320 configured to operate at a high frequency band, such as the PCS band. Filter 320 can be coupled with a PCS band duplexer 350. Triplexer 240 can also comprise a filter 330 configured to operate at a mid frequency band, such as the GPS frequency band. Filter 330 can, therefore, be coupled with GPS receiver circuitry 360. Triplexer 240 can also comprise a filter 340 configured to operate at a low frequency band, such as the cellular band. Filter 340 can, therefore, be coupled with a cellular band duplexer 370.

Again, it should be noted that triplexer 240 can be configured to work in other frequency bands besides the PCS, GPS, and cellular frequency bands. Moreover, the frequency covered by a particular frequency band, such as the PCS and cellular band, can vary depending on the country or continent of operation. Thus, triplexer 240 can generically be described as comprising a high frequency filter 320, a mid frequency filter 330, and a low frequency filter 340.

From a circuit board area perspective, it may be preferable that filters 320, 330, and 340 be constructed using L/Cs; however, L/Cs may not provide enough isolation, or rejection, of other frequency band signals. For example, in the United States, the PCS transmit band is in the high 1800 MHz region. The GPS receive band is at approximately 1575 MHz, and the cellular receive band is in the 800 MHz region. The cellular receive band is sufficiently distant in terms of frequency from the PCS and GPS receive bands, such that isolation is not much of a concern. But the PCS and GPS receive bands are relatively close, which makes isolation a more relevant issue. If there is not enough isolation, then some of the energy in a received GPS signal can be shunted through PCS filter 320, desensing both the PCS and GPS receivers. Conversely, a portion of a received PCS signal can be shunted through GPS filter 330 desensing both receivers. Thus, if L/Cs are used for filters 320 and 330, it is important to ensure that the resulting Quality (Q) factor is sufficiently high to provide adequate isolation between the two receivers.

In this regard, it may actually be preferable to use SAW filters for one or both of filters 320 and 330, because SAW filters typically have higher Qs and provide better isolation. SAW filters, however, are relatively large compared to simple L/C filter components. Therefore, for each particular implementation, circuit board area and isolation must be traded off in determining whether to use L/C or SAWs for each of filters 320, 330, and 340. For example, due to the greater need for isolation between a GPS filter 330 and a PCS filter 320, a SAW filter can be used for filter 330. Because the cellular band is sufficiently distant from the PCS and GPS bands, however, a lower Q L/C filter can be used for filter 340. Depending on the application, a SAW or L/C filter can then be used for filter 320. Thus, one or more of filters 320, 330, and 340 can be L/C filters and one or more can be SAW filters, depending on the tradeoffs and requirements for a particular implementation.

Preferably, however, there would be no need to tradeoff size versus isolation in the design of filters 320, 330, and 340. Fortunately, a new device called Film Bulk Acoustic Resonator (FBAR) can be used to achieve high Q filters with very small footprints. Like SAW devices, FBAR devices convert electrical signals into mechanical waves that resonate through the filter material and are then converted back to electrical signals at the appropriate output. But unlike SAW filters, the mechanical waves travel through the body of the material not just across the surface. This allows superior power handling and operation at frequencies as high as 7.5 Ghz. Moreover, FBAR devices can be made extremely small.

Therefore, in one embodiment of triplexer 240, each filter 320, 330, and 340 is an FBAR filter. In other embodiments, less than all of filters 320, 330, and 340 can be FBAR filters depending on the requirements of a particular implementation.

Accordingly, triplexer 240 allows a single antenna 110 to be used for three different frequency bands, which eliminates, for example, the need for a separate GPS antenna. Eliminating the extra antenna reduces the cost of wireless communication device 100, and eliminates the cosmetic and practical disadvantages of including a second antenna in wireless communication device 100. Further, using triplexer 240, as opposed to a diplexer 140 and one or more switching modules 170 also reduces costs, requires less circuit board area, and lowers the insertion loss for one or more receivers included in wireless communication device 100. Moreover, using FBAR material allows tight integration of the filters 320, 330, and 340 comprising triplexer 240, while providing very high Q filter devices.

Figure 12:
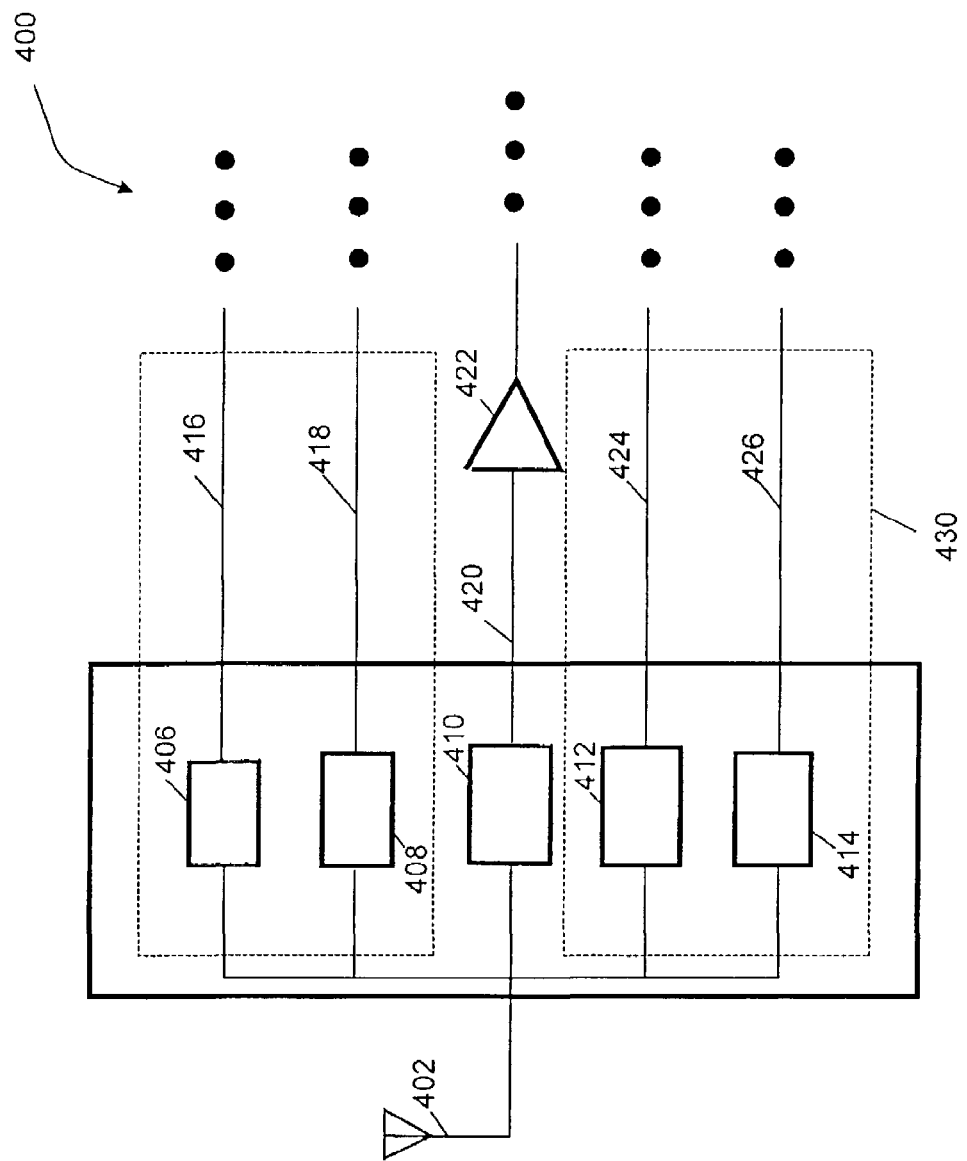
FIG. 12 shows selected components of an example embodiment of a wireless communication device comprising an N-plexer in accordance with the invention.

In another embodiment, duplexer 350 and 370 (see FIG. 11), are also integrated with filters 320, 330, and 340, to form what can be termed an N-plexer. Such an N-plexer 404 is illustrated in FIG. 12, which is a logical block diagram illustrating example components of a wireless communication device 400. Wireless communication device 400 comprises an antenna 402 that is configured to transmit and receive signals in a plurality of communication bands. Antenna 402 is coupled with N-plexer 404, which comprises a plurality of filters 406-414.

For example, antenna 402 can be configured to transmit and receive PCS and cellular signals, i.e., device 400 can be configured for dual band operation. Wireless communication device 400 can also be configured for GPS operation, in which case filters 406-414 can be grouped into three communication ports. One communication port 428 can be configured as a PCS communication port and can comprise filters 406 and 408. Filter 406 can in turn be configured to receive PCS transmit signals via transmit signal line 416 from a PCS transceiver (not shown) also included in wireless communication device 400. The PCS transmit signals are then passed to antenna 402 for transmission. Filter 408, on the other hand, can be configured to receive PCS receive signals from antenna 402 and pass them, via receive signal line 418 to the PCS transceiver (not shown).

Filters 406 and 408 can be configured as bandpass filters that pass signals within the PCS transmit and receive bandwidths, respectively. In addition, filters 406 and 408 can be configured to provide isolation between the PCS transmit and receive paths 416 and 418, so that they do not interfere with each other and are isolated from signals in other communication bands, e.g., the GPS and cellular bands.

Similarly, a cellular communication port 430 can comprise filters 412 and 414. Filters 412 and 414 can, therefore, be configured to pass transmit and receive cellular signals, respectively, between antenna 402 and a cellular transceiver (not shown) via signal paths 424 and 426, respectively. Further, filters 412 and 414 can be configured to provide isolation relative to signals outside of the transmit and receive cellular bandwidths.

Filter 410 can be configured to pass GPS receive signals received by antenna 402 to GPS receive circuitry 422 via receive signal path 420. Filter 410 can also be configured to provide isolation from signals outside the GPS receive bandwidth.

Accordingly, N-plexer 404 can be configured to replace the combination of triplexer 240 and duplexers 350 and 370. This not only reduces the number of components required, but also reduces the insertion loss for the various transmit and receive signal paths. Of course, N-plexer 404 can be configured for other communication bands. Further, a fourth, fifth, etc. signal port can be added to N-plexer 404 as required by a specific wireless communication device 400. Therefore, N-plexer 404 should not be viewed as being limited to a certain number of communication ports or to implementations involving specific communication bands.

As described with respect to triplexer 240, filters 406-414 can comprise L/Cs or SAW devices as required by a particular application. From a circuit board area standpoint, L/Cs may be preferable to SAW devices, but SAW devices typically provide more isolation and higher Qs. Preferably, however, FBAR devices are used for each of the filter devices 406-414. This is because FBAR provides high isolation, high Q, and a small footprint, which not only makes it easier to implement N-plexer 404, but also makes it easier to add additional communication ports to N-plexer 404 if required.

Figure 13:
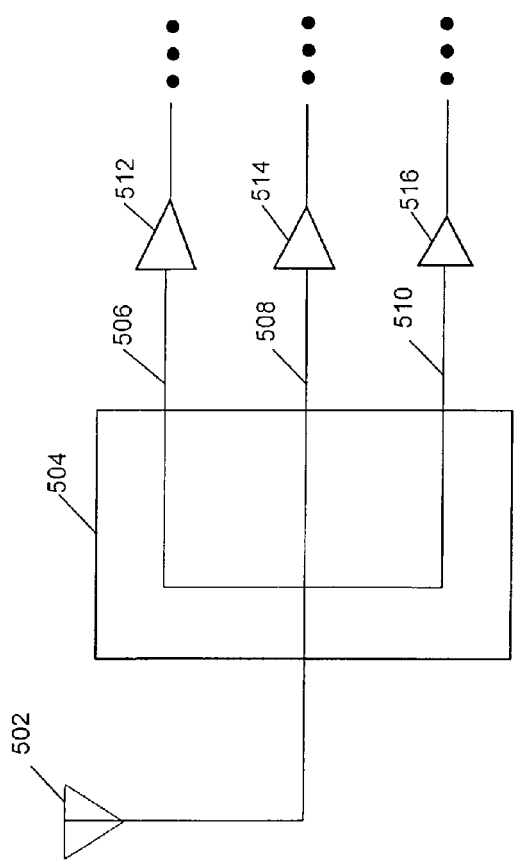
FIG. 13 shows selected components of another exemplary embodiment of the wireless communication device illustrated in FIG. 12.

In FIG. 13, it can be seen that including an N-plexer 504 in a wireless communication device 500, which is configured for dual band communication and GPS operation for example, reduces the number of components between antenna 502 and the receive circuits 512, 514, and 516. Thus, the insertion loss is reduced as well as the component count. Further, if N-plexer 504 is constructed from FBAR material, then the overall circuit board area requirement can also be reduced.

In FIG. 13, the receive paths 506, 508, and 510 for three communication ports included in N-plexer 504 are illustrated. Thus, receive path 506 can be a PCS receive path, receive path 508 can be a GPS receive path, and receive path 510 can be a cellular receive path. Receive path 506 is then coupled with an amplifier 512 that comprises a part of a PCS receiver included in wireless communication device 500. Similarly, receive paths 508 and 510 will be coupled with amplifiers 514 and 516, which comprise part of a GPS receiver and a cellular receiver, respectively, included in wireless communication device 500.

Amplifiers 512, 514, and 516 are generally LNAs. LNAs are key components in Radio Frequency (RF) receivers because they take received signals, which are typically at very low power levels, and amplify them to a level sufficient for further processing without adding additional noise that may mask or distort the low power received signals. In a conventional wireless communication device, each receive path has a corresponding LNA that is configured for optimal performance over the frequency band associated with the particular receive path. But since the diplexers, switches, and duplexers can be reduced to a single device 504, it would be advantageous to be able to use a single LNA for two or more receive paths, especially where the communication bands associated with the receive paths are close, such as with the PCS and GPS bands.

Figure 14:
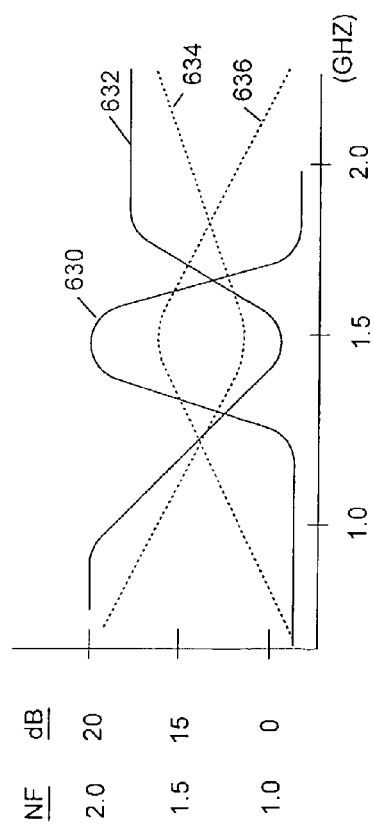
FIG. 14 is a diagram illustrating a graph of the gain and noise figure for a amplifier that can be included in the wireless communication device of FIG. 13.

To obtain the best Noise Figure (NF) for a conventional LNA, it is often best to provide a termination impedance of approximately 90 ohms. Unfortunately, the output of most filter devices that interface with an LNA is 50 ohms. This includes most conventional diplexers and duplexers, as well as most embodiments of triplexer 240 and N-plexer 504. Providing a 50 ohm impedance instead of a 90 ohm impedance lowers the LNA input Q and broadens the LNA pass band. This can be illustrated with the use of the curves graphed in FIG. 14. In FIG. 14, curve 630 illustrates the gain curve for an LNA when the input impedance is 90 ohms. Thus, the gain in decibels (dB) is graphed against the frequency in Hertz (Hz). It can be seen that the LNA has a relatively narrow pass band centered at approximately 1.5 GHz in the example of FIG. 14. Curve 632 graphs the corresponding NF, which is relatively good over the pass band.

When, however, a 50 ohm input impedance is used, gain curve 636 and NF 634 are obtained. As can be seen, the pass band for curve 636 is broadened, but the gain across the pass band is reduced. The NF 634 is also somewhat degraded across the pass band. Fortunately, even when the lower gain and degraded NF are taken into account, the wider pass band can be taken advantage of to allow a single LNA to be used for more than one receive path, especially where the associate receive bandwidths are relatively close.

Figure 15:
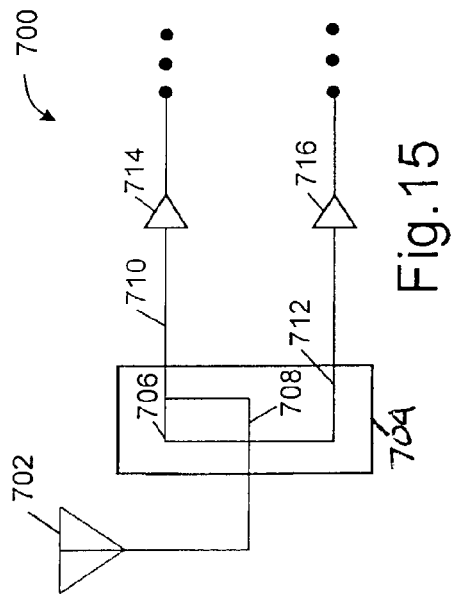
FIG. 15 shows selected components of still another exemplary embodiment of the wireless communication device illustrated in FIG. 12.

In FIG. 15, for example, a PCS receive path 706 and a GPS receive path 708 are both coupled over a single receive signal path 710 with a single LNA 714 in wireless communication device 700. As explained above, the impedance of signal path 710 is 50 ohms. Wireless communication device 700 can also comprise, for example, a cellular receive path 712 interface with a LNA 716. Each receive path 706, 708, and 712 can, for example, comprise part of a corresponding communications port in a N-plexer 704, which in turn is interfaced with antenna 702.

Because the impedance of signal path 710 can be 50 ohms, a broader pass band can be obtained for LNA 714 that can, for example, be broad enough for use at both the GPS receive band and the PCS receive band. Thus, for example, by simply using a 50 ohm termination, LNA 714 can be configured for dual use on both PCS and GPS signals. Further, the loss in gain and degraded NF in each receive band can be counter balanced by lowering the insertion loss using, for example, N-plexer 704. Accordingly, a LNA 714 with a pass band centered at the PCS receive band can be used for both PCS and GPS signals. Alternatively, a LNA 714 with a pass band centered at the GPS receive band can be used for both signals, or a LNA 714 with a pass band somewhere in between the GPS and PCS receive bands or close to one or the other can be used.

Figure 16:
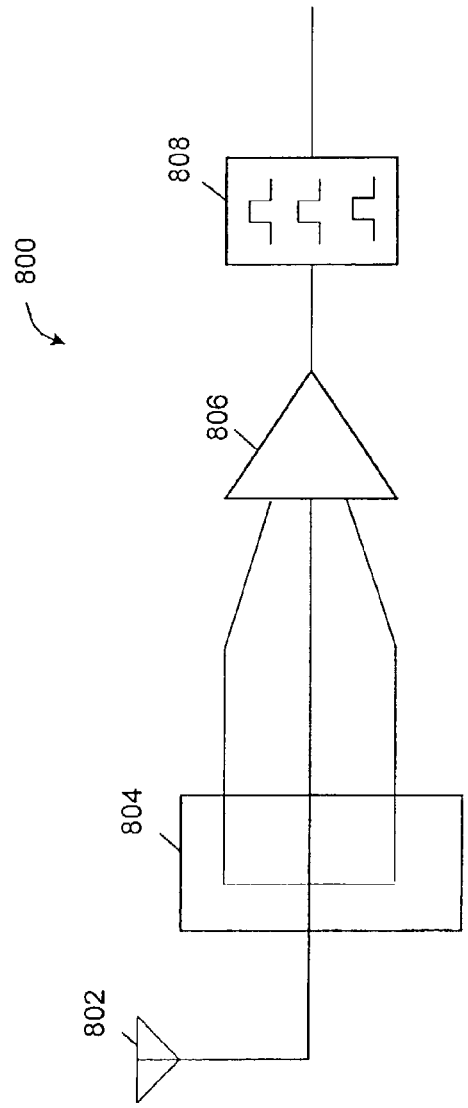
FIG. 16 shows selected components of an example embodiment of a wireless communication device comprising single multiport image rejection filter in accordance with the invention.

The reuse of a single LNA is not limited to reusing the LNA for only two receive paths. For example, a LNA centered at 1.5 GHz and with a pass band such as that illustrated by curve 634 in FIG. 14 can be used for PCS signals, GPS signals, and cellular signals. Thus, as illustrated in FIG. 16, a wireless communication device 800 can comprise an antenna 802 configured to transmit and receive signals in a plurality of communication bands, an N-plexer 804 comprising a plurality of communication ports, and a single LNA 806 configured to amplify receive signals for two or more of the communication bands.

If, for example, antenna 802 is configured to receive PCS, GPS, and cellular signals, then N-plexer 804 can comprises a PCS, GPS, and cellular communication port. LNA 806 can then be used to amplify received PCS, GPS, and cellular signals. Further, because N-plexer 804 is used, which reduces the insertion losses, the lower gain and degraded NF that results from using single LNA 806 can be counter balanced. The center of the pass band of LNA 806 can also be adjusted if required to increase the gain for a particular band, e.g., the center frequency can be shifted down to get more gain in the cellular band if required by a particular application.

Wireless communication device 800 can also include image rejection filter 808. In a conventional receiver, an image rejection filter typically follows the LNA. The image rejection filter is configured to reduce, among other things, the noise and response in the image band so that the noise response does not interfere with proper reception of a received signal. Thus, in a wireless communication device configured to receive signals in a plurality of communication bands, a discrete image rejection filter would be required for each communication band. But in order to reduce the number of components, a single image rejection filter 808 can be configured to filter signals for each communication band received by wireless communication device 800.

Thus, for example, image rejection filter 808 can comprise three signal ports: one configured to filter PCS signals, one configured to filter GPS signals, and one configured to filter cellular signals. Each signal port preferably comprises a FBAR filter device, but can comprise filters constructed using L/Cs and/or SAW devices as is the case for N-plexer 804.

Accordingly, by implementing the systems and methods described above, a wireless communication device 800 configured to receive signals in a plurality of communication bands can comprise a single antenna 802, a single N-plexer 804, a single LNA 806, and a single image rejection filter 808. Alternatively, partial integration at the N-plexer, LNA, and/or image rejection filter stages, according to the systems and methods described herein, can still be implemented to reduce component counts, circuit board area requirements, and cost. Thus, for example, a dual band, GPS enabled, wireless communication device can be made very small and inexpensive. Although, as previously mentioned, the systems and methods described herein are not limited to particular implementations or to use with any specific communication bands.

Therefore, while embodiments and implementations of the invention have been shown and described, it should be apparent that many more embodiments and implementations are within the scope of the invention. Accordingly, the invention is not to be restricted, except in light of the claims and their equivalents.

What is claimed is:

1. A method of configuring a wireless communication device to receive signals in a plurality of signal bands, comprising:
   determining a required gain for each of the plurality of signal bands;
   determining a required noise figure for each of the plurality of signal bands;
   determining an impedance for each of the plurality of signal bands as seen by a single amplifier that will approximately result in the required gain and noise figure for each of the plurality of receive signals when amplified by the amplifier;
   configuring receive signal paths associated with each of the plurality of signal bands so that the appropriate determined impedances are presented to the amplifier when the amplifier is receiving signals in a particular signal band;
   selecting an input impedance of the amplifier to broaden a pass band of the amplifier; and
   offsetting any reduction in noise figure for each of the receive signal paths by reducing the insertion loss for each of the receive signal paths by configuring the wireless communication device to use a single image rejection filter.

2. The method of claim 1, wherein reducing the insertion loss comprises configuring the wireless communication device to use a N-plexer.

3. The method of claim 1, wherein reducing the insertion loss comprises configuring the wireless communication device to use a triplexer.

4. The method of claim 1, further comprising determining a pass band center frequency near the frequency of one of the plurality of receive signal bands and configuring the amplifier to have a pass band near the determined pass band center frequency.

5. The method of claim 4, wherein configuring the amplifier comprises shifting the pass band center frequency down with a filter so that receive signals received at lower frequencies receive greater amplification.

6. The method of claim 4, wherein configuring the amplifier comprises shifting the pass band center frequency up with a filter so that receive signals received at higher frequencies receive greater amplification.

7. The method of claim 4, wherein the wireless communication device is configured to receive a high frequency receive signal, a mid frequency receive signal, and a low frequency receive signal, and wherein configuring the amplifier comprises configuring the amplifier to have a pass band center frequency near a frequency band associated with the low frequency receive signal.

8. The method of claim 4, wherein the wireless communication device is configured to receive a high frequency receive signal, a mid frequency receive signal, and a low frequency receive signal, and wherein configuring the amplifier comprises configuring the amplifier to have a pass band center frequency near a frequency band associated with the high frequency receive signal.

9. The method of claim 4, wherein the wireless communication device is configured to receive a high frequency receive signal, a mid frequency receive signal, and a low frequency receive signal, and wherein configuring the amplifier comprises configuring the amplifier to have a pass band center frequency near a frequency band associated with the mid frequency receive signal.

10. A wireless communication device, comprising:
    a single amplifier having an input for receiving signals and an output, the amplifier configured, by selecting an input impedance of the amplifier to broaden a pass band of the amplifier, to amplify received signals associated with each of a plurality of receive signal paths including the amplifier, each receive signal path configured to receive signals in a corresponding frequency band having a required gain and a required noise figure, the plurality of receive signal paths configured to present an impedance to the amplifier resulting in the required gain and required noise figure of the receive band corresponding to the received signals being amplified by the amplifier; and
    a single image rejection filter coupled with the amplifier output, the single image rejection filter configured to filter the amplified received signals generated by the amplifier to offset any reduction in noise figure for each of the receive signal paths by reducing the insertion loss for each of the receive signal paths.

11. The wireless communication device of claim 10, further comprising a plurality of discrete image rejection filters integrated into the single image rejection filter and coupled with the amplifier output, each of the plurality of discrete image rejection filters associated with one of the plurality of receive signal paths.

12. The wireless communication device of claim 10, wherein the single image rejection filter is a FBAR device.

13. The wireless communication device of claim 10, wherein the amplifier is a low noise amplifier.

14. The wireless communication device of claim 10, further comprising:
    an antenna configured to transmit and receive the signals in the plurality of communication bands and connected to the plurality of receive signal paths.

15. The wireless communication device of claim 14, wherein the antenna is configured to receive GPS signals in the GPS band.

16. The wireless communication device of claim 14, wherein the antenna is configured to receive PCS signals in the PCS band.

17. The wireless communication device of claim 14, wherein the antenna is configured to receive cellular signals in the cellular band.

18. The wireless communication device of claim 14, wherein the single image rejection filter is a FBAR device.

19. The wireless communication device of claim 14, wherein the amplifier is a low noise amplifier.

20. A wireless communication device, comprising:
    a plurality of receive paths comprising a single rejection filter connected to an output of a single amplifier having an amplifier input impedance, each receive path having a noise figure and a gain within a frequency bandwidth, the plurality of receive paths configured to present a receive path impedance less than the amplifier input impedance to an input of the amplifier to broaden a pass band of the amplifier and configured to at least partially offset reduction in noise figure and gain due to a mismatch between the receive path impedance and the amplifier input impedance to maintain the gain and noise figure for each corresponding frequency bandwidth to be greater than or equal to the minimum gain and minimum noise figure for receiving the signals within the corresponding frequency bandwidth.

* * * * *